United States Patent
Park et al.

(10) Patent No.: US 9,634,288 B2
(45) Date of Patent: Apr. 25, 2017

(54) ORGANIC LIGHT EMITTING DISPLAY DEVICE

(71) Applicant: Samsung Display Co., Ltd., Yongin, Gyeonggi-Do (KR)

(72) Inventors: Sang-Ho Park, Suwon-si (KR); Dae-Young Lee, Seoul (KR); Seung-Min Lee, Jeju-si (KR); Jung-Woo Moon, Suwon-si (KR); Young-Woo Song, Suwon-si (KR); Joo-Sun Yoon, Seoul (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/724,546

(22) Filed: May 28, 2015

(65) Prior Publication Data

US 2016/0043349 A1 Feb. 11, 2016

(30) Foreign Application Priority Data

Aug. 11, 2014 (KR) .................. 10-2014-0103221

(51) Int. Cl.
*H01L 29/08* (2006.01)
*H01L 51/52* (2006.01)
*H01L 27/32* (2006.01)

(52) U.S. Cl.
CPC ...... *H01L 51/5271* (2013.01); *H01L 27/3244* (2013.01); *H01L 51/5237* (2013.01)

(58) Field of Classification Search
CPC ............ H01L 51/5271; H01L 51/5278; H01L 51/5281; H01L 51/5287; H01L 51/5296; H01L 27/3262; H01L 27/3265; H01L 51/5237

See application file for complete search history.

(56) References Cited

U.S. PATENT DOCUMENTS

| | | | |
|---|---|---|---|
| 2010/0112373 A1* | 5/2010 | Coffey | B32B 33/00 428/608 |
| 2012/0146004 A1* | 6/2012 | Lee | H01L 27/1255 257/40 |
| 2013/0075778 A1* | 3/2013 | Nakanishi | B82Y 20/00 257/99 |
| 2013/0146335 A1* | 6/2013 | Gambino | H01L 31/1884 174/251 |
| 2014/0003005 A1 | 1/2014 | Moran et al. | |
| 2014/0077187 A1* | 3/2014 | Lee | H01L 51/5281 257/40 |
| 2014/0183462 A1* | 7/2014 | Lee | H01L 51/5262 257/40 |

FOREIGN PATENT DOCUMENTS

| | | | | |
|---|---|---|---|---|
| KR | 1020060134022 A | 12/2006 | | |
| KR | 1020080022846 A | 3/2008 | | |
| KR | 10-2013-0015471 | * | 2/2013 | .......... G02F 1/1335 |
| KR | 1020130015471 A | 2/2013 | | |

* cited by examiner

*Primary Examiner* — Khiem D Nguyen
(74) *Attorney, Agent, or Firm* — Innovation Counsel LLP (57) ABSTRACT

An organic light emitting display device includes a substrate, a light emitting structure, and a reflective metal layer. The substrate includes a pixel region and a peripheral region. The light emitting structure is disposed on the substrate. The reflective metal layer is disposed between the substrate and the light emitting structure. The reflective metal layer includes a plurality of nanowires and a plurality of openings that is defined by the nanowires.

15 Claims, 9 Drawing Sheets

ORGANIC LIGHT EMITTING DISPLAY DEVICE

CROSS-REFERENCE TO RELATED APPLICATION(S)

This application claims priority under 35 USC §119 to Korean Patent Application No. 10-2014-0103221, filed on Aug. 11, 2014 in the Korean Intellectual Property Office (KIPO), the contents of which are incorporated herein in its entirety by reference.

BACKGROUND

1. Technical Field

Example embodiments relate generally to organic light emitting display devices. More particularly, embodiments of the present inventive concept relate to organic light emitting display devices including a reflective metal layer having a plurality of nanowires.

2. Description of the Related Art

A flat panel display (FPD) device is widely used as a display device of an electronic device because the FPD device is lightweight and thin compared to a cathode-ray tube (CRT) display device. Typical examples of the FPD device are a liquid crystal display (LCD) device and an organic light emitting display (OLED) device. Compared to the LCD device, the OLED device has many advantages such as a higher luminance and a wider viewing angle. In addition, the OLED device can be made thinner because the OLED device does not require a backlight. In the OLED device, electrons and holes are injected into an organic thin layer through a cathode and an anode, and then recombined in the organic thin layer to generate excitons, thereby a light of a certain wavelength can be emitted.

Recently, as the OLED device has a metal serving as a mirror, a mirror OLED device capable of displaying an image of an object (or target) that is located in the front of the OLED device has been developed. In this case, the metal is formed as a mesh structure, and the image of the object that is located in the front of the OLED device is displayed by the mesh structure. However, in a conventional mirror OLED device, a size (or width) of a line (e.g., wiring, electrode) included in the mesh structure may have micrometers. Since the mesh structure is perceived by a user that is located in the front of the mirror OLED device, visibility of a displaying image may be decreased.

SUMMARY

Some example embodiments provide an organic light emitting display device including a reflective metal layer having a plurality of nanowires.

According to one aspect of example embodiments, an organic light emitting display device includes a substrate, a light emitting structure, and a reflective metal layer. The substrate includes a pixel region and a peripheral region. The light emitting structure is disposed on the substrate. The reflective metal layer is disposed between the substrate and the light emitting structure. The reflective metal layer includes a plurality of nanowires and a plurality of openings that is defined by the nanowires.

In example embodiments, the nanowires of the reflective metal layer may include a plurality of first nanowires.

In example embodiments, the first nanowires may have a first thickness and a first width, and the first nanowires may extend along a first direction.

In example embodiments, the first nanowires may be spaced apart from each other by a first distance.

In example embodiments, the nanowires of the reflective metal layer may further include a plurality of second nanowires.

In example embodiments, the second nanowires may have a second thickness and a second width, and the second nanowires may extend along a second direction that is perpendicular to the first direction.

In example embodiments, the second nanowires may be spaced apart from each other by a second distance.

In example embodiments, the first nanowires and the second nanowires may be crossed with each other at the same level on the substrate.

In example embodiments, the second nanowires may be disposed on the first nanowires.

In example embodiments, a reflective index and a transmittivity of the organic light emitting display device may be controlled according to the first and second thicknesses, the first and second widths, and the first and second distances.

In example embodiments, a size of each of the openings may be controlled according to the first and second distances.

In example embodiments, the reflective metal layer may have a mesh structure.

In example embodiments, each of the openings of the reflective metal layer may have a planar shape of a rectangular opening or a square opening.

In example embodiments, the organic light emitting display device may further include a buffer layer disposed between the reflective metal layer and the light emitting structure.

In example embodiments, the reflective metal layer may include a first surface contacting the substrate, and a second surface opposite to the first surface.

In example embodiments, the first surface may be configured to reflect an incident light passing through the substrate, and the second surface may contact the buffer layer.

In example embodiments, the substrate may include transparent materials.

In example embodiments, the light emitting structure may include a planarization layer, a first electrode, a power supply electrode, a light emitting layer, a second electrode, and an encapsulation substrate.

In example embodiments, the planarization layer may be disposed on the buffer layer.

In example embodiments, the first electrode may be disposed on the planarization layer in the pixel region.

In example embodiments, the power supply electrode may be disposed on the planarization layer in the peripheral region.

In example embodiments, the power supply electrode may contact the first electrode in the peripheral region.

In example embodiments, the light emitting layer may be disposed on the first electrode in the pixel region.

In example embodiments, the second electrode may be disposed on the light emitting layer.

In example embodiments, the encapsulation substrate may be disposed on the second electrode.

In example embodiments, a light configured to be generated from the light emitting layer may travel via the openings of the reflective metal layer.

In example embodiments, the organic light emitting display device may further include at least one semiconductor element disposed on the buffer layer in the peripheral region and a capacitor disposed on the buffer layer in the peripheral region.

In example embodiments, the capacitor may be spaced apart from the at least one semiconductor element.

In example embodiments, the at least one semiconductor element may include a first semiconductor element having a first active pattern, a gate insulating layer disposed on the first active pattern, a first gate electrode disposed on the gate insulating layer, the power supply electrode contacting a first side of the first active pattern, and a first drain electrode contacting a second side of the first active pattern.

In example embodiments, the capacitor may include a first capacitor electrode disposed on the gate insulating layer, a second capacitor electrode contacting the power supply electrode and disposed on the first capacitor electrode, and a first insulating layer disposed between the first capacitor electrode and the second capacitor electrode.

In example embodiments, the at least one semiconductor may include a second semiconductor element having a second active pattern, the gate insulating layer disposed on the second active pattern, a second gate electrode disposed on the gate insulating layer, and each of second source and drain electrodes contacting each of first and second sides of the second active pattern.

In example embodiments, the buffer layer, the gate insulating layer, the first insulating layer, and the planarization layer may include transparent materials, and the organic light emitting display device may have a bottom emission type.

As an organic light emitting display device according to example embodiments includes the reflective metal layer having the nanowires, visibility of a displaying image is increased.

BRIEF DESCRIPTION OF THE DRAWINGS

Example embodiments can be understood in more detail from the following description taken in conjunction with the accompanying drawings, in which:

FIGS. 7A, 7B, 7C, 7D, 7E, 7F, 7G, 7H, 7I are cross sectional views illustrating a method of manufacturing an organic light emitting display device in accordance with example embodiments.

DETAILED DESCRIPTION OF THE EMBODIMENTS

Hereinafter, embodiments of the present inventive concept will be explained in detail with reference to the accompanying drawings.

Figure 1:
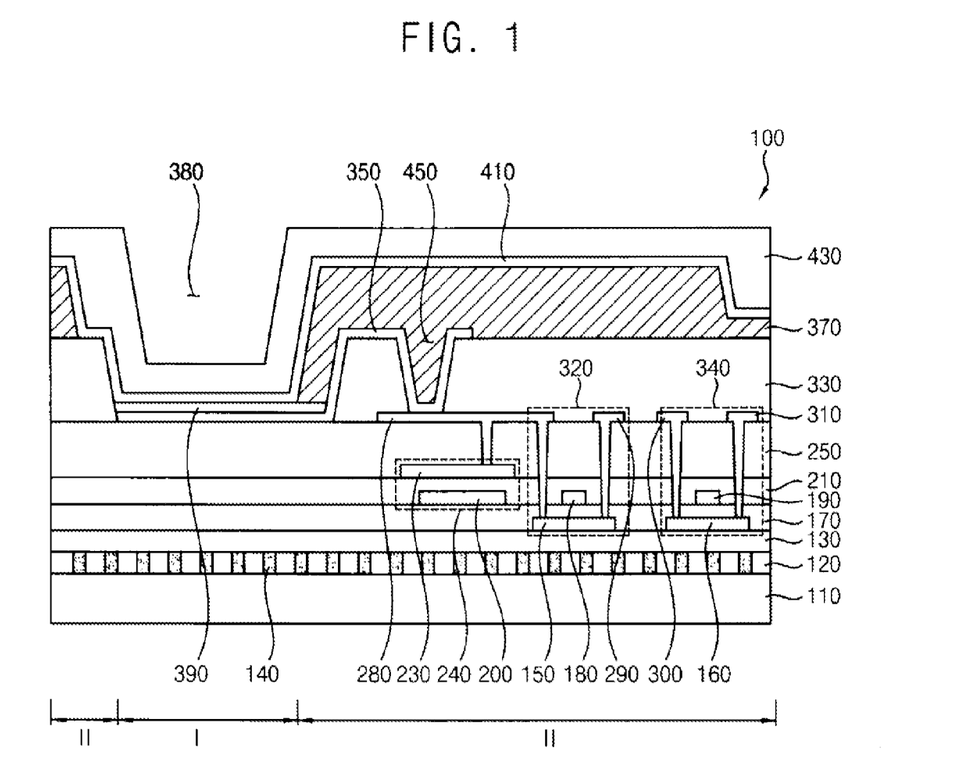
FIG. 1 is a cross sectional view illustrating an organic light emitting display device in accordance with example embodiments.
Figure 2:
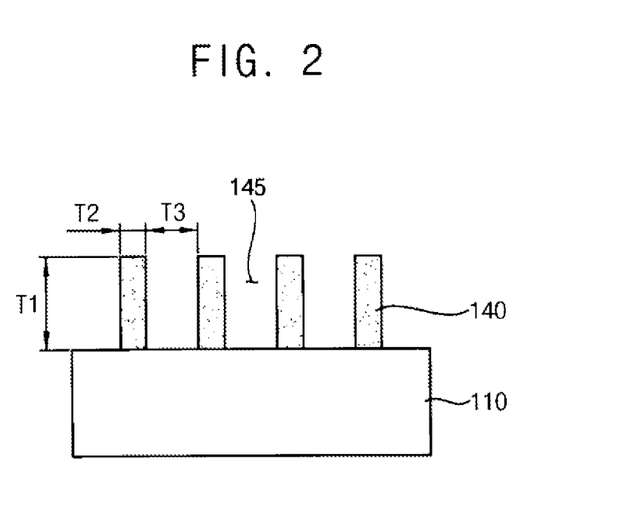
FIG. 2 is a cross sectional view for describing an example of a reflective metal layer included in an organic light emitting display device of FIG. 1.
Figure 3:
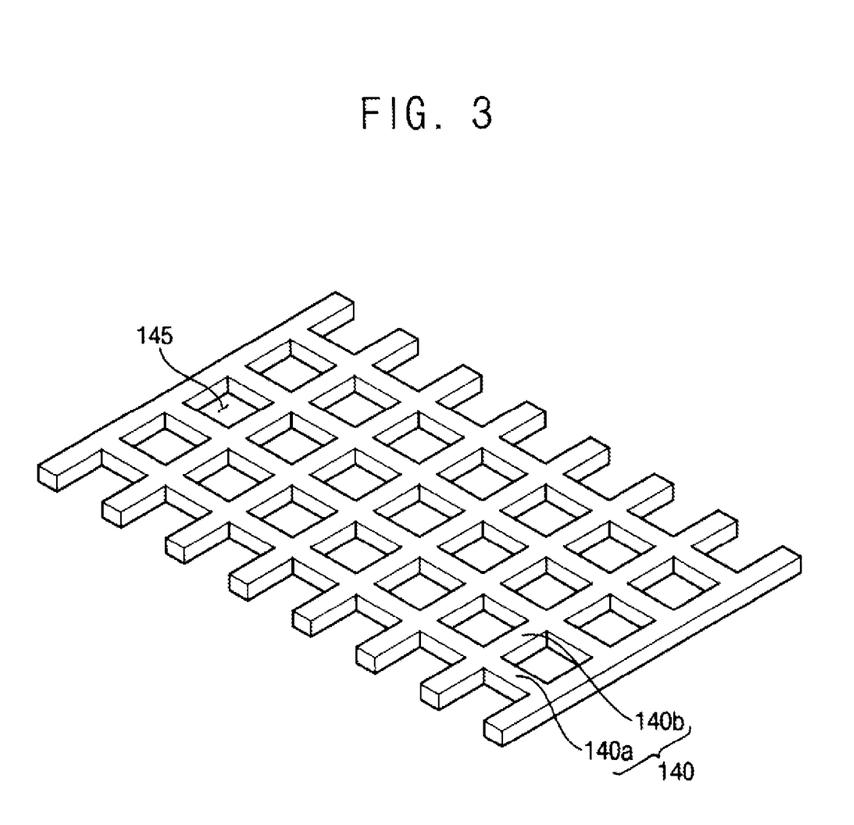
FIG. 3 is a perspective view for describing a reflective metal layer of FIG. 2.

FIG. 1 is a cross sectional view illustrating an organic light emitting display device 100 in accordance with example embodiments, and FIG. 2 is a cross sectional view for describing an example of a reflective metal layer 140 included in the organic light emitting display device 100 of FIG. 1. FIG. 3 is a perspective view for describing the reflective metal layer 140 of FIG. 2.

Referring to FIGS. 1 through 3, the organic light emitting display (OLED) device 100 may include a substrate 110, the reflective metal layer 140, a base layer 120, a buffer layer 130, a driving transistor 320, e.g., a first semiconductor element, a switching transistor 340, e.g., a second semiconductor element, a storage capacitor 240, a gate insulating layer 170, a first insulating layer 210, a second insulating layer 330, a light emitting structure, etc. Here, the light emitting structure may include a planarization layer 250, a power supply electrode 280, a first electrode 350, a light emitting layer 390, a pixel defining layer 370, a second electrode 410, an encapsulation substrate 430, etc.

In example embodiments, the OLED device 100 may include a pixel region I and a peripheral region II that surrounds the pixel region I. In this case, the first electrode 350, the light emitting layer 390, and the second electrode 410 may be disposed in the pixel region I. The driving transistor 320, the switching transistor 340, the storage capacitor 240, the power supply electrode 280, the second insulating layer 330, and the pixel defining layer 370 may be disposed in the peripheral region II. For example, the OLED device 100 may have a bottom emission type. The reflective metal layer 140 may be entirely disposed in the pixel region I and the peripheral region II. For example, the reflective metal layer 140 may reflect an image of an object that is located in the front. Accordingly, the OLED device 100 may serve as a mirror display device.

The substrate 110 may include a transparent inorganic material or a flexible plastic. As the OLED device 100 includes the display region I and the peripheral region II, the substrate 110 may include the display region I and the peripheral region II. For example, the substrate 110 may include a glass substrate, a quartz substrate, a synthetic quartz substrate, a calcium fluoride substrate, a fluoride-doping quartz substrate, a sodalime substrate, non-alkali substrate etc. Alternatively, the substrate 110 may include a flexible transparent resin substrate. Here, the flexible transparent resin substrate for the substrate 110 may include a polyimide substrate. For example, the polyimide substrate may include a first polyimide layer, a barrier film layer, a second polyimide layer, etc. Alternately, the substrate 110 may have a structure in which the first polyimide layer, the barrier film layer and the second polyimide layer are stacked on a glass substrate. Here, after an insulation layer is provided on the second polyimide layer, a light emitting structure, e.g., the driving transistor 320, the switching transistor 340, the storage capacitor 240, the power supply electrode 280, the first electrode 350, the light emitting layer 390, the second electrode 410, etc., may be disposed on the insulation layer. After the light emitting structure is formed on the insulation layer, the glass substrate may be removed. It may be difficult that the light emitting structure is directly formed on the polyimide substrate because the polyimide substrate is thin and flexible. Accordingly, the light emitting structure is formed on a rigid glass substrate, and then the polyimide substrate may be used as the substrate 110 after a removal of the glass substrate.

In example embodiments, the reflective metal layer 140 may be disposed on the substrate 110. The reflective metal layer 140 may extend from the pixel region I into the peripheral region II. That is, the reflective metal layer 140 may be entirely disposed in the pixel region I and the peripheral region II. The reflective metal layer 140 may include a first surface and a second surface. The first surface, e.g., a lower surface, of the reflective metal layer 140 may contact the substrate 110. The second surface, e.g., a top surface, that is opposite to the first surface may contact the buffer layer 130. In some example embodiments, after an additional insulating layer is disposed on the substrate 110, the reflective metal layer 140 may be disposed on the additional insulating layer. The additional insulating layer may include inorganic materials or organic materials according to component materials of the substrate 110 and/or the reflective metal layer 140.

In example embodiments illustrated in FIGS. 2 and 3, the reflective metal layer 140 may include a plurality of nanowires. The nanowires may define a plurality of openings 145. In other word, the reflective metal layer 140 may include a configuration that one opening 145 is disposed between adjacent two of the nanowires. The nanowires may include a plurality of first nanowires 140A and a plurality of second nanowires 140B. Each of the first nanowires 140A may have a first thickness and a first width, and may extend along a first direction, e.g., a column direction. Adjacent first nanowires 140A may be spaced apart from each other by a first distance, and may be arranged substantially parallel to each other. Each of the second nanowires 140B may have a second thickness and a second width, and may extend along a second direction, e.g., a row direction, that is perpendicular to the first direction. Adjacent second nanowires 140B may be spaced apart from each other by a second distance, and may be arranged substantially parallel to each other.

The first nanowires 140A and the second nanowires 140B may be disposed substantially at the same level. In addition, the first nanowires 140A and the second nanowires 140B may be crossed to each other. Accordingly, the reflective metal layer 140 including the first nanowires 140A and the second nanowires 140B may substantially have a mesh structure. The reflective metal layer 140 may include materials having a relatively high reflective index. For example, the reflective metal layer 140 may include gold (Au), silver (Ag), aluminum (Al), platinum (Pt), nickel (Ni), titanium (Ti), etc. Alternately, the reflective metal layer 140 may include alloy, metal nitride, conductive metal oxide, transparent conductive materials, etc. For example, the reflective metal layer 140 may include aluminum alloy, aluminum nitride (AlNx), silver alloy, tungsten nitride (WNx), copper alloy, chrome nitride (CrNx), molybdenum alloy, titanium nitride (TiNx), tantalum nitride (TaNx), strontium ruthenium oxide (SRO), zinc oxide (ZnOx), indium tin oxide (ITO), stannum oxide (SnOx), indium oxide (InOx), gallium oxide (GaOx), indium zinc oxide (IZO), etc. These may be used alone or in a combination thereof.

Since each of the first nanowires 140A and the second nanowires 140B have a nano size, e.g., nanoscale, the first nanowires 140A and the second nanowires 140B may be obtained using nano-imprinting method. In example embodiments, a thickness T1 of the reflective metal layer 140 may be each of the first thickness of the first nanowires 140A and each of the second thickness of the second nanowires 140B. That is, the first thickness of the first nanowires 140A and the second thickness of the second nanowires 140B may be substantially the same and equal to the thickness T1 of the reflective metal layer 140. In addition, a width T2 of the reflective metal layer 140 may be each of the first width of the first nanowires 140A and each of the second width of the second nanowires 140B. That is, the first width of the first nanowires 140A and the second width of the second nanowires 140B may be substantially the same and equal to the width T2. Further, a distance T3 of the reflective metal layer 140 may be the first distance between adjacent first nanowires 140A and the second distance between adjacent second nanowires 140B. That is, the first distance between the adjacent first nanowires 140A and the second distance between the adjacent second nanowires 140B may be substantially the same and equal to the distance T3.

A size of each of the openings 145 of the reflective metal layer 140 may be controlled, e.g., a shape of the openings 145 is changed, according to the first distance between the adjacent first nanowires 140A and the second distance between the adjacent second nanowires 140B. For example, when the first distance and the second distance are the same, the openings 145 may substantially have a planar shape of a square opening. In some example embodiments, when the first distance is different from the second distance, the openings 145 may substantially have a planar shape of a rectangular opening.

In example embodiments, a reflective index and a transmittivity of the OLED device 100 may be controlled according to the first thickness, the first width, and the first distance of the first nanowires 140A and the second thickness, the second width, and the second distance of the second nanowires 140B. For example, in a nano-imprinting, when each of the thickness, width, and distance T1, T2, and T3 of the reflective metal layer 140 is formed in each of about 150, 40, and 100 nanometer, the reflective index and the transmittivity of the OLED device 100 may be over about 40%. The first surface of the reflective metal layer 140 may reflect an incident light passing through the substrate 110, e.g., an image of an object that is located in the front of the OLED device 100 may be displayed on the first surface of the reflective metal layer 140. In addition, a light generated from the light emitting layer 390 of the OLED device 100 may travel via the openings 145 of the reflective metal layer 140 disposed in the pixel region I. In example embodiments, when the base layer 120 include a material such as elastomer, elasticity or resilience of the reflective metal layer 140 obtained using the nano-imprinting method may be increased because the base layer 120 surrounds the reflective metal layer 140 of the mesh structure.

When the substrate 110 includes transparent flexible materials, the OLED device 100 including the reflective metal layer 140 having lattices of a nanoscale may serve as a flexible mirror display device. In addition, since a size of each of the lattices included in the reflective metal layer 140 is substantially formed in the nanoscale, a user may not substantially perceive the lattices via the front of the OLED device 100. Accordingly, visibility of a displaying image of the OLED device 100 including the reflective metal layer 140 having the lattices of the nanoscale may be increased.

Referring again to FIG. 1, the base layer 120 may be disposed on the substrate 110 and the reflective metal layer 140. The base layer 120 may include inorganic materials. For example, the base layer 120 may include silicon oxide (SiOx), silicon nitride (SiNx), silicon oxynitride (SiOxNy), silicon oxycarbide (SiOxCy), silicon carbonitride (SiCxNy), etc. Alternately, the base layer 120 may include organic materials. For example, the base layer 120 may include polyimide-based resin, photoresist, acrylic-based resin, polyamide-based resin, siloxane-based resin, etc. In example embodiments, the base layer 120 may substantially fill the openings 145 of the reflective metal layer 140, and may expose the second surface of the reflective metal layer 140.

In some example embodiments, the base layer 120 may fill the openings 145 of the reflective metal layer 140, and may cover the reflective metal layer 140. Alternately, the base layer 120 may not be disposed, and the buffer layer 130 may be disposed on the substrate 110 and the reflective metal layer 140.

The buffer layer 130 may be disposed on the base layer 120. The buffer layer 130 may prevent the diffusion, e.g., an out gassing, of metal atoms and/or impurities from the substrate 110. Additionally, the buffer layer 130 may control a rate of a heat transfer in a crystallization process for forming a first active pattern 150 and a second active pattern 160, thereby obtaining substantially uniform the first and the second active patterns 150 and 160. For example, the buffer layer 130 may include silicon nitride, silicon oxide, etc. In some example embodiments, only one buffer layer or no buffer layer may be provided on the substrate 110 in accordance with the type of the substrate 110.

The driving transistor 320 may be disposed on the buffer layer 130. The driving transistor 320 may include the first active pattern 150, the gate insulating layer 170, a first gate electrode 180, the first insulating layer 210, the planarization layer 250, a first source electrode, a first drain electrode 290, etc. Here, the first source electrode may be connected to the power supply electrode 280, and a high power supply voltage ELVDD may be applied to the first source electrode. For example, the OLED device 100 may include the power supply electrode 280, e.g., a high power supply electrode, and a low power supply electrode (not shown). The high power supply voltage ELVDD may be provided to the power supply electrode 280, and the low power supply voltage ELVSS may be provided to the low power supply electrode.

The switching transistor 340 may be disposed on the buffer layer 130. The switching transistor 340 may include the second active pattern 160, the gate insulating layer 170, a second gate electrode 190, the first insulating layer 210, the planarization layer 250, a second source electrode 300, a second drain electrode 310, etc.

The storage capacitor 240 may be disposed on the gate insulating layer 170. In example embodiments, the storage capacitor 240 may include a first capacitor electrode 200, the first insulating layer 210, a second capacitor electrode 230, etc. Here, the second capacitor electrode 230 may be connected to the power supply electrode 280, and the high power supply voltage ELVDD may be applied to the second capacitor electrode 230.

The driving transistor 320 and the switching transistor 340 may be positioned in the peripheral region II. In the driving transistor 320 and the switching transistor 340, the first and second active patterns 150 and 160 may be disposed spacing apart from each other by a predetermined distance in the peripheral region II on the buffer layer 130. For example, each of the first and second active patterns 150 and 160 may include an oxide semiconductor, an inorganic semiconductor, e.g., amorphous silicon, polysilicon, etc., an organic semiconductor, etc.

The gate insulating layer 170 may be disposed on the buffer layer 130. The gate insulating layer 170 may cover the first and second active patterns 150 and 160, and may extend into the pixel region I. For example, the gate insulating layer 170 may include a silicon compound, a metal oxide, etc. Alternately, the gate insulating layer 170 may include a material substantially the same as that of the buffer layer 130.

The first gate electrode 180 may be disposed on the gate insulating layer 170 under which the first active pattern 150 is positioned. The second gate electrode 190 may be disposed on the gate insulating layer 170 under which the second active pattern 160 is positioned. Each of the first gate electrode 180 and the second gate electrode 190 may include metal, alloy, metal nitride, conductive metal oxide, a transparent conductive material, etc.

The first capacitor electrode 200 may be disposed on the gate insulating layer 170. The first capacitor electrode 200 may be spaced apart from the first gate electrode 180 by predetermined distances. The first capacitor electrode 200, the first gate electrode 180, and the second gate electrode 190 may include substantially the same material. Alternately, each of the first capacitor electrode 200, the first gate electrode 180, and the second gate electrode 190 may include different materials.

The first insulating layer 210 may be disposed on the gate insulating layer 170, the first capacitor electrode 200, the first gate electrode 180, and the second gate electrode 190. The first insulating layer 210 may cover the first capacitor electrode 200, the first gate electrode 180, and the second gate electrode 190, and may extend into the pixel region I. For example, the first insulating layer 210 may include a silicon compound, a metal oxide, etc. Alternately, the first insulating layer 210 may include a material substantially the same as that of the buffer layer 130 and the gate insulating layer 170. In example embodiments, when the first insulating layer 210, the buffer layer 130, and the gate insulating layer 170 are the same material in the pixel region I, the OLED device 100 may have a bottom emission type.

The second capacitor electrode 230 may be disposed on the first insulating layer 210 under which the first capacitor electrode 200 is positioned. The second capacitor electrode 230 may include a material substantially the same as that of the first gate electrode 180, the second gate electrode 190, and the first capacitor electrode 200. Alternately, each of the second capacitor electrode 230, the first gate electrode 180, the second gate electrode 190, and the first capacitor electrode 200 may include different materials.

The planarization layer 250 may be disposed on the first insulating layer 210 and the second capacitor electrode 230. The planarization layer 250 may cover the second capacitor electrode 230, and may extend into the pixel region I. For example, the planarization layer 250 may include a silicon compound, a metal oxide, etc. Alternately, the planarization layer 250, the first insulating layer 210, the buffer layer 130, and the gate insulating layer 170 may include substantially the same material. In example embodiments, when the planarization layer 250, the first insulating layer 210, the buffer layer 130, and the gate insulating layer 170 are the same material in the pixel region I, the OLED device 100 may have a bottom emission type. In addition, a thickness of the planarization layer 250 may be substantially greater than that of the first insulating layer 210. For example, the thickness of the planarization layer 250 may be substantially greater than that of the buffer layer 130, the gate insulating layer 170, and the first insulating layer 210. Thus, a coupling phenomenon which may be generated between the power supply electrode 280 and the second capacitor electrode 230 may be reduced.

A portion of the first electrode 350, the light emitting layer 390, a portion of the second electrode 410, a portion of the pixel defining layer 370, and a portion of the encapsulation substrate 430 may be disposed in the pixel region I on the planarization layer 250. The power supply electrode 280, the first source electrode of the driving transistor 320, the first drain electrode 290 of the driving transistor 320, the second source electrode 300 of the switching transistor 340, the second drain electrode 310 of the switching transistor 340, the second insulating layer 330, a portion of the pixel defining layer 370, a portion of the first electrode 350, a portion of the second electrode 410, and a portion of the encapsulation substrate 430 may be disposed in the peripheral region II on the planarization layer 250.

The first source electrode of the driving transistor 320 and the first drain electrode 290 of the driving transistor 320 may contact the first active pattern 150 by removing portions of the planarization layer 250, the first insulating layer 210, and the gate insulating layer 170. Each of the first source electrode and the first drain electrode 290 may include metal, alloy, metal nitride, conductive metal oxide, a transparent conductive material, etc. These may be used alone or in a combination thereof.

The second source electrode 300 of the switching transistor 340 and the second drain electrode 310 of the switching transistor 340 may contact the second active pattern 160 by removing portions of the planarization layer 250, the first insulating layer 210, and the gate insulating layer 170. Each of the second source electrode 300 and the second drain electrode 310 may include a material substantially the same as that of the first source electrode of the driving transistor 320 and the first drain electrode 290 of the driving transistor 320.

The power supply electrode 280 may electrically contact the second capacitor electrode 230 and the first active pattern 150 via contact holes. The high power supply voltage ELVDD applied to the power supply electrode 280 may be provide to the second capacitor electrode 230 and the first active pattern 150. The power supply electrode 280 may include a material substantially the same as that of the first drain electrode 290, the second source electrode 300, and the second drain electrode 310.

The second insulating layer 330 may cover the first source electrode, the first drain electrode 290, the second source electrode 300, and the second drain electrode 310. The second insulating layer 330 may include a first opening 380 and a second opening 450. The first opening 380 of the second insulating layer 330 may be positioned in the pixel region I, and the second opening 450 of the second insulating layer 330 may be positioned in the peripheral region II. A portion of the first electrode 350 may be disposed on the first opening 380 of the second insulating layer 330. The first electrode 350 disposed in the first opening 380 may extend into the peripheral region II, and may be disposed on the second opening 450. Here, the first electrode 350 may contact a portion of the power supply electrode 280 via the second opening 450. The second insulating layer 330 may include inorganic materials or organic materials.

The first electrode 350 may be disposed on the first opening 380 of the second insulating layer 330 in the pixel region I, and may extend into the peripheral region II. Here, as the first electrode 350 extends into the peripheral region II, the first electrode 350 may be disposed on the second opening 450 of the second insulating layer 330. The first electrode 350 may include metal, alloy, metal nitride, conductive metal oxide, a transparent conductive material, etc.

The light emitting layer 390 may be disposed on the first electrode 350. The light emitting layer 390 may be formed using light emitting materials capable of generating different colors of light, e.g., a red color of light, a blue color of light, and a green color of light. Alternately, the light emitting layer 390 may generally generate a white color of light by stacking a plurality of light emitting materials capable of generating different colors of light such as a red color of light, a green color of light, a blue color of light, etc.

The pixel defining layer 370 may be disposed on a portion of the light emitting layer 390, a portion of the first electrode 350, and a portion of the second insulating layer 330. The pixel defining layer 370 interposed between the first electrode 350 and the second electrode 410 in the pixel region I may electrically insulate the first electrode 350 and the second electrode 410. The pixel defining layer 370 may include organic materials or inorganic materials. Alternately, the pixel defining layer 370 may include a material substantially the same as that of the second insulating layer 330.

The second electrode 410 may be disposed on the pixel defining layer 370 and the light emitting layer 390. For example, the second electrode 410 may be disposed as a substantially uniform thickness along a profile of the pixel defining layer 370 and the light emitting layer 390. That is, the second electrode 410 may be entirely disposed in the pixel region I and the peripheral region II. In example embodiments, the second electrode 410 may include a metal, an alloy, metal nitride, conductive metal oxide, a transparent conductive material, etc.

The encapsulation substrate 430 may be disposed on the second electrode 410. The encapsulation substrate 430 may be disposed along a profile of the second electrode 410. The encapsulation substrate 430 may include a transparent material or flexible plastic. For example, the encapsulation substrate 430 may include a rigid glass substrate, a quartz substrate, etc. In addition, the encapsulation substrate 430 may also include a flexible transparent resin substrate. In example embodiments, to increase flexibility of the OLED device 100, the encapsulation substrate 430 may include a stacked structure where at least one organic layer and at least one inorganic layer are alternately stacked. Here, the inorganic layer may include silicon oxide (SiOx), silicon nitride (SiNx), silicon oxynitride (SiOxNy), silicon oxycarbide (SiOxCy), silicon carbonitride (SiCxNy), aluminium oxide (AlOx), aluminium nitride (AlNx), titanium oxide (TiOx), zinc oxide (ZnOx), etc. Meanwhile, the organic layer may include photoresist, polyimide-based resin, acrylic-based resin, polyamide-based resin, siloxane-based resin, olefin-based resin, acrylate monomer, phenylacetylene, diamine, dianhydride, silane, parylene, polyethylene (PE), polypropylene (PP), polyethylene terephthalate (PET), epoxy resin, fluoro resin, polysiloxane, etc.

The OLED device 100 in accordance with example embodiments may include the transparent flexible substrate 110, the flexible encapsulation substrate 430, and the reflective metal layer 140 having the lattices of the nanoscale. Here, when the base layer 120 include a material such as elastomer, elasticity or resilience of the reflective metal layer 140 having the lattices of the nanoscale may be increased because the base layer 120 surrounds the reflective metal layer 140 having the lattices. In addition, the OLED device 100 may serve as a flexible mirror display device. Further, since the lattices of the reflective metal layer 140 have the nanoscale, a user that is located in the front of the OLED device 100 may not perceive the lattices of the reflective metal layer 140. Thus, visibility of a displaying image of the OLED device 100 including the reflective metal layer 140 of the nanoscale may be increased.

Figure 4:
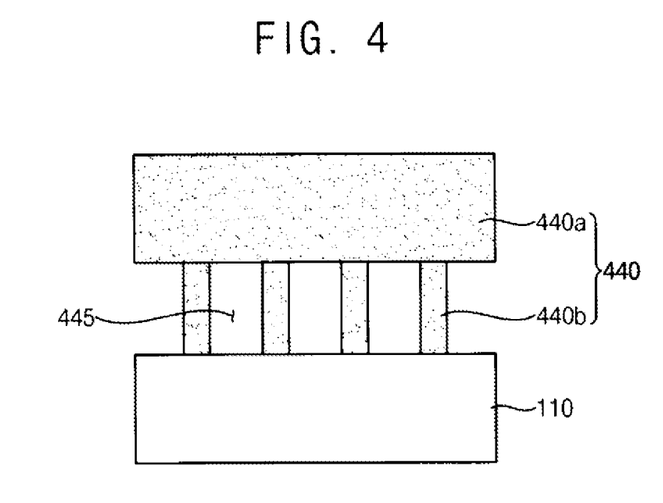
FIG. 4 is a cross sectional view for describing another example of a reflective metal layer included in an organic light emitting display device of FIG. 1.
Figure 5:
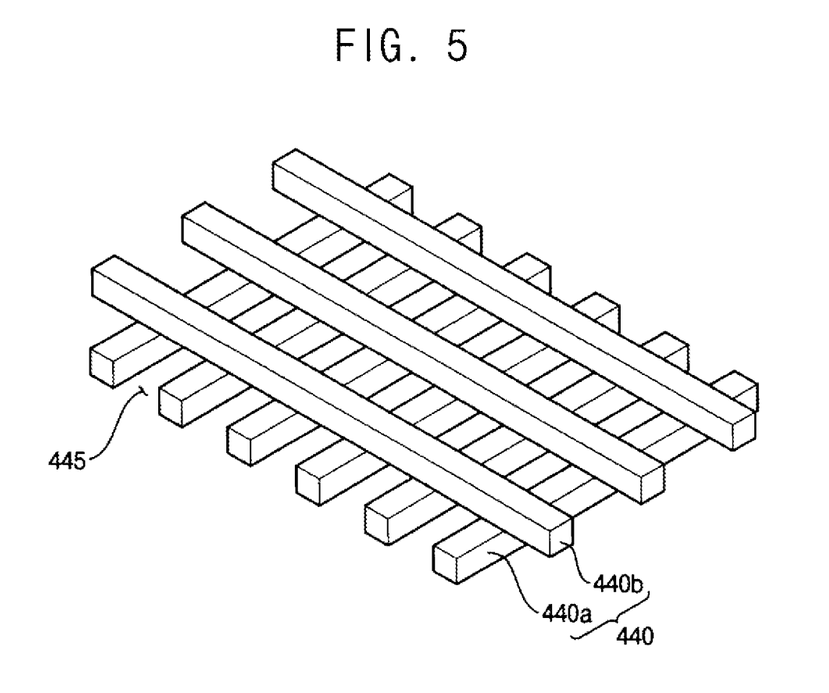
FIG. 5 is a perspective view for describing a reflective metal layer of FIG. 4.

FIG. 4 is a cross sectional view for describing another example of a reflective metal layer 440 included in the organic light emitting display device 100 of FIG. 1, and FIG. 5 is a perspective view for describing the reflective metal layer 440 of FIG. 4. The reflective metal layer 440 illustrated in FIG. 4 may have a configuration substantially the same as or similar to that of the reflective metal layer 140 described with reference to FIGS. 1 through 3 except each of positions of first and second nanowires 440A and 440B. In FIG. 4, detailed descriptions for elements, which are substantially the same as or similar to the elements described with reference to FIGS. 1 through 3, will be omitted.

Referring to FIGS. 4 and 5, the reflective metal layer 440 may be disposed on the substrate 110. The reflective metal layer 440 may extend from the pixel region I into the peripheral region II. That is, the reflective metal layer 440 may be entirely disposed in the pixel region I and the peripheral region II. The reflective metal layer 440 may include a plurality of nanowires. The nanowires may define a plurality of openings 445. In other word, the reflective metal layer 440 may include a configuration that one opening 445 is disposed between adjacent two of the nanowires. The nanowires may include a plurality of first nanowires 440A and a plurality of second nanowires 440B. Each of the first nanowires 440A may have a first thickness and a first width, and may extend along a first direction, e.g., a column direction. Adjacent first nanowires 440A may be spaced apart from each other by a first distance, and may be arranged substantially parallel to each other. Each of the second nanowires 440B may have a second thickness and a second width, and may extend along a second direction, e.g., a row direction, that is perpendicular to the first direction. Adjacent second nanowires 440B may be spaced apart from each other by a second distance, and may be arranged substantially parallel to each other. The first nanowires 440A may be disposed on the second nanowires 440B. Thus, the reflective metal layer 440 including the first nanowires 440A and the second nanowires 440B may substantially have a mesh structure. The reflective metal layer 440 may include materials having a relatively high reflective index. For example, the reflective metal layer 440 may include Au, Ag, Al, Pt, Ni, Ti, etc. Since each of the first nanowires 440A and the second nanowires 440B have a nano scale, the first nanowires 440A and the second nanowires 440B may be obtained using nano-imprinting method. In example embodiments, the first thickness of the first nanowires 440A and the second thickness of the second nanowires 440B may be substantially the same. In addition, the first width of the first nanowires 440A and the second width of the second nanowires 440B may be substantially the same. Further, the first distance between the adjacent first nanowires 440A and the second distance between the adjacent second nanowires 440B may be substantially the same.

A size of each of the openings 445 of the reflective metal layer 440 may be controlled, e.g., a shape of the openings 445 is changed, according to the first distance between the adjacent first nanowires 440A and the second distance between the adjacent second nanowires 440B. For example, when the first distance and the second distance are the same, the openings 445 may substantially have a planar shape of a square opening. Meanwhile, when the first distance is different from the second distance, the openings 445 may substantially have a planar shape of a rectangular opening.

In example embodiments, a reflective index and a transmittivity of the OLED device 100 may be controlled according to the first thickness, the first width, and the first distance of the first nanowires 440A and the second thickness, the second width, and the second distance of the second nanowires 440B. A light generated from a light emitting layer 390 of the OLED device 100 may travel via the openings 445 of the reflective metal layer 440 disposed in the pixel region I. Accordingly, an image of an object that is located in the front of the OLED device may be displayed on a lower surface of the first nanowires 440A and the second nanowires 440B. As when a base layer includes a material such as elastomer, elasticity or resilience of the reflective metal layer 440 having a width, a thickness, and a distance of the nanoscale may be increased because the base layer surrounds the first nanowires 440A and the second nanowires 440B. In addition, the OLED device 100 may serve as a flexible mirror display device.

Figure 6:
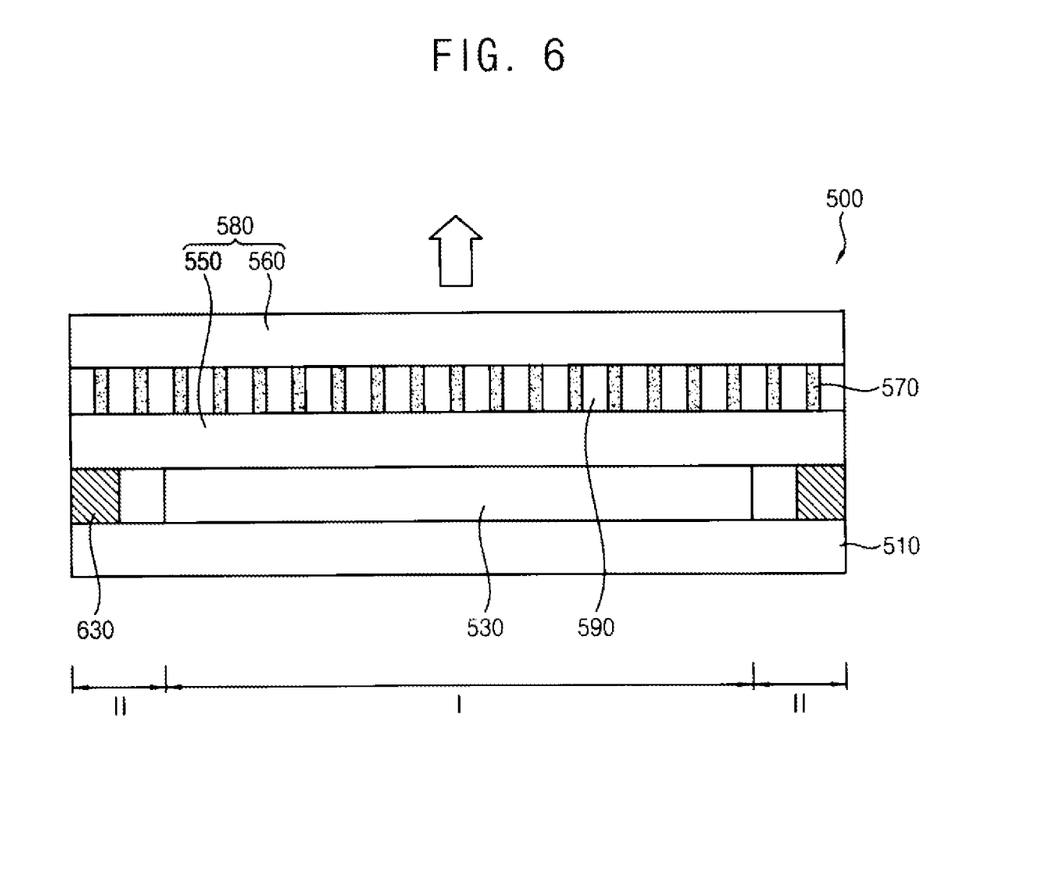
FIG. 6 is a cross sectional view illustrating an organic light emitting display device in accordance with some example embodiments.

FIG. 6 is a cross sectional view illustrating an organic light emitting display device 500 in accordance with some example embodiments. The organic light emitting display device 500 illustrated in FIG. 6 may have a configuration substantially the same as or similar to that of the organic light emitting display device 100 described with reference to FIGS. 1 through 3 except a position of a reflective metal layer 570. In FIG. 6, detailed descriptions for elements, which are substantially the same as or similar to the elements described with reference to FIGS. 1 through 3, will be omitted.

Referring to FIG. 6, the organic light emitting display (OLED) device 500 may include a substrate 510, a light emitting structure, a sealant 630, a base layer 590, the reflective metal layer 570, and an encapsulation substrate 580. In example embodiments, the OLED device 500 may include a pixel region I and a peripheral region I.

The substrate 510 may include a transparent inorganic material or a flexible plastic. For example, the substrate 510 may include a glass substrate, a quartz substrate, a synthetic quartz substrate, a calcium fluoride substrate, a fluoride-doping quartz substrate, a sodalime substrate, non-alkali substrate etc. The substrate 510 may include a flexible transparent resin substrate. As the OLED device 500 includes the display region I and the peripheral region II, the substrate 510 may include the display region I and the peripheral region II.

The light emitting structure 530 may be disposed in the pixel region I on the substrate 510. The light emitting structure 530 may include a driving transistor, a switching transistor, a storage capacitor, a first electrode, a light emitting layer, a second electrode, etc. In example embodiments, the light emitting structure 530 may have a top emission type.

The sealant 630 may be disposed in peripheral region II on the substrate 510. In example embodiments, the sealant 630 may include frit and the like. In some example embodiments, the sealant 630 may additionally include a photo curable material. For example, a laser may be irradiated in the peripheral region II where the sealant 630 is located. In the laser irradiation, a phase of the sealant 630 may be changed from a solid phase to a liquid phase, and then the sealant 630 in the liquid phase may be cured to the solid phase after a predetermined time. In accordance with the phase change of the sealant 630, the encapsulation substrate 580 may be combined with the substrate 510 to seal the encapsulation substrate 580 relative to the substrate 510.

The encapsulation substrate 580 may be disposed on the light emitting structure 530 and the sealant 630. The encapsulation substrate 580 may include a transparent inorganic material, flexible plastic, a flexible transparent resin substrate. In example embodiments, the encapsulation substrate 580 may include a stacked structure where at least one organic layer 560 and at least one inorganic layer 550 are alternately stacked. For example, the organic layer 560 may be disposed on the inorganic layer 550. Here, the inorganic layer 550 may include SiOx, SiNx, SiOxNy, SiOxCy, SiCxNy, AlOx, AlNx, TiOx, ZnOx, etc. The organic layer 560 may include photoresist, polyimide-based resin, acrylic-based resin, polyamide-based resin, siloxane-based resin, olefin-based resin, acrylate monomer, phenylacetylene, diamine, dianhydride, silane, parylene, PE, PP, PET, epoxy resin, fluoro resin, polysiloxane, etc.

The reflective metal 570 may be disposed between the inorganic layer 550 and the organic layer 560. The reflective metal layer 570 may extend from the pixel region I into the peripheral region II. In example embodiments, the reflective metal layer 570 may include a first surface and a second surface. The first surface, e.g., a lower surface, of the reflective metal layer 570 may contact the inorganic layer 550. The second surface, e.g., a top surface, that is opposite to the first surface may contact the organic layer 560. The reflective metal layer 570 may include a plurality of nanowires (refer to FIGS. 2 and 3). The nanowires may define a plurality of openings. In other word, the reflective metal layer 570 may include a configuration that one opening is disposed between adjacent two of the nanowires. The nanowires may include a plurality of first nanowires and a plurality of second nanowires. The first nanowires may extend along a column direction. Adjacent first nanowires may be spaced apart from each other by a first distance, and may be arranged substantially parallel to each other. The second nanowires may extend along a row direction that is perpendicular to the column direction. Adjacent second nanowires may be spaced apart from each other by a second distance, and may be arranged substantially parallel to each other.

The first nanowires and the second nanowires may be disposed substantially at the same level. In addition, the first nanowires and the second nanowires may be crossed to each other. Accordingly, the reflective metal layer 570 including the first nanowires and the second nanowires may substantially have a mesh structure. The reflective metal layer 570 may include materials having a relatively high reflective index. For example, the reflective metal layer 570 may include Au, Ag, Al, Pt, Ni, Ti, etc. Since each of the first nanowires and the second nanowires has a nanoscale, the first nanowires and the second nanowires may be obtained using nano-imprinting method. The first distance between the adjacent first nanowires and the second distance between the adjacent second nanowires may be substantially the same. A size of each of the openings of the reflective metal layer 570 may be controlled, e.g., a shape of the openings is changed, according to the first distance between the adjacent first nanowires and the second distance between the adjacent second nanowires. In example embodiments, when the first distance and the second distance are the same, the openings may substantially have a planar shape of a square opening. In some example embodiments, when the first distance is different from the second distance, the openings may substantially have a planar shape of a rectangular opening. The second surface of the reflective metal layer 570 may reflect an incident light passing through the organic layer 560, e.g., an image of an object that is located in the front of the OLED device 500 may be displayed on the second surface of the reflective metal layer 570. In addition, a light generated from the light emitting layer of the OLED device 500 may travel via the openings of the reflective metal layer 570 disposed in the pixel region I. In example embodiments, when the base layer 590 include a material such as elastomer, elasticity or resilence of the reflective metal layer 570 obtained using the nano-imprinting method may be increased, because the base layer 590 surrounds the reflective metal layer 570 of the mesh, e.g., lattice, structure.

Accordingly, when the OLED device 500 includes the flexible substrate 510 and the transparent flexible encapsulation substrate 580, the OLED device 500 including reflective metal layer 570 having the lattices of the nanoscale may serve as a flexible mirror display device. In addition, the OLED device 500 may include the reflective metal layer 570, which is formed using the nano-imprinting method, of an In-Cell structure disposed between the inorganic layer 550 and the organic layer 560. Further, since a size of each of the lattices included in the reflective metal layer 570 is substantially formed in the nanoscale, a user that is located in the front of the OLED device 500 may not substantially perceive the lattices. Accordingly, visibility of a displaying image of the OLED device 500 including the reflective metal layer 570 having the lattices of the nanoscale may be increased.

The base layer 590 may be disposed between the inorganic layer 550 and the organic layer 560. For example, after the inorganic layer 550 is disposed using a chemical vapor deposition method, the reflective metal layer 570 may be disposed using the nano-imprinting method. Then, the base layer 590 may be disposed on the inorganic layer 550 and the reflective metal layer 570. The base layer 590 may include transparent inorganic or organic materials. In example embodiments, the base layer 590 may expose the second surface of the reflective metal layer 570, and then may contact the organic layer 560. In some example embodiments, the base layer 590 may cover the reflective metal layer 570, or the organic layer 560 may be disposed on the inorganic layer 550 without the base layer 590. Alternately, the inorganic layer 550 and the organic layer 560 may be alternately stacked on the encapsulation substrate 580.

FIGS. 7A through 7I are cross sectional views illustrating a method of manufacturing an organic light emitting display device in accordance with example embodiments.

Figure 7A:
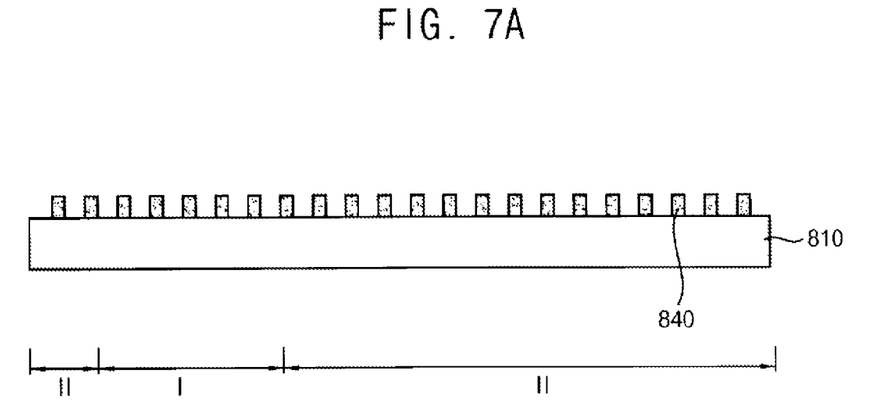
Figure 7B:
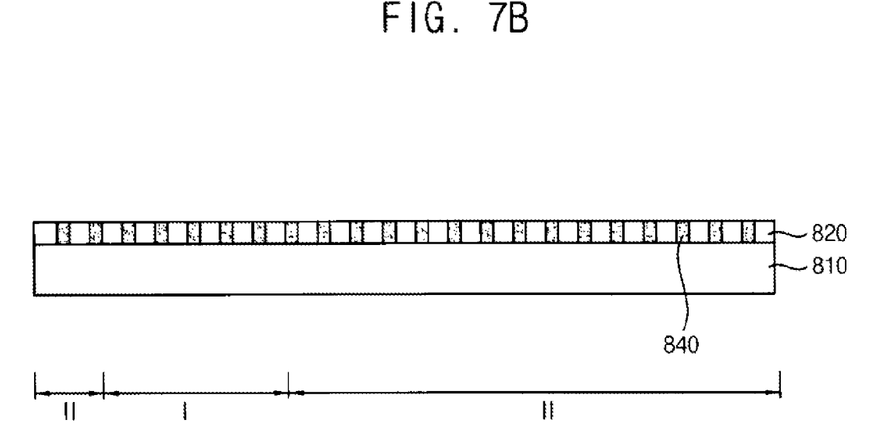

Referring to FIGS. 7A and 7B, a reflective metal layer 840 may be formed on a substrate 810, and may extend from the pixel region I into the peripheral region II. In example embodiments, the substrate 810 may be formed using a flexible transparent resin substrate. The reflective metal layer 840 may include a first surface that contacts the substrate 810 and a second surface that is opposite to the first surface.

The reflective metal layer 840 may include a plurality of nanowires. The nanowires may define a plurality of openings. In other word, the reflective metal layer 840 may include a configuration that one opening is formed between adjacent two of the nanowires. The nanowires may include a plurality of first nanowires and a plurality of second nanowires. The first nanowires may extend along a column direction. Adjacent first nanowires may be spaced apart from each other by a first distance, and may be formed in substantially parallel to each other. The second nanowires may extend along a row direction that is perpendicular to the column direction. Adjacent second nanowires may be spaced apart from each other by a second distance, and may be formed in substantially parallel to each other. The first nanowires and the second nanowires may be formed substantially at the same level. In addition, the first nanowires and the second nanowires may be crossed to each other. Accordingly, the reflective metal layer 840 including the first nanowires and the second nanowires may be substantially formed as a mesh structure. The reflective metal layer 840 may be formed using materials having a relatively high reflective index. For example, the reflective metal layer 570 may include Au, Ag, Al, Pt, Ni, Ti, etc. Since each of the first nanowires and the second nanowires has a nanoscale, the first nanowires and the second nanowires may be formed using nano-imprinting method. The first distance between the adjacent first nanowires and the second distance between the adjacent second nanowires may be substantially the same. Here, a size of each of the openings of the reflective metal layer 840 may be controlled according to the first distance between the adjacent first nanowires and the second distance between the adjacent second nanowires. For example, a shape of the openings is changed. In example embodiments, when the first distance and the second distance are the same, the openings may substantially have a planar shape of a square opening. The first surface of the reflective metal layer 840 may reflect an incident light passing through the substrate 810, and a light generated from the light emitting layer of an organic light emitting display (OLED) device may travel via the openings of the reflective metal layer 840 disposed in the pixel region I. In example embodiments, when the base layer 820 include a material such as elastomer, elasticity or resilence of the reflective metal layer 840 obtained using the nano-imprinting method may be increased because the base layer 820 surrounds the reflective metal layer 840 of the mesh structure. In addition, since a size of each of the lattices included in the reflective metal layer 840 is substantially formed in the nanoscale, a user may not substantially perceive the lattices via the front of the OLED device. Accordingly, visibility of a displaying image of the OLED device including the reflective metal layer 840 having the lattices of the nanoscale may be improved.

A base layer 820 may be formed on the substrate 810 and the reflective metal layer 840. The base layer 820 may be formed using transparent inorganic materials or transparent organic materials. In example embodiments, the base layer 820 may substantially fill the opening of the reflective metal layer 840, and may expose the second surface of the reflective metal layer 840. In some example embodiments, the base layer 820 may fill the opening of the reflective metal layer 840, and may cover the reflective metal layer 840. Alternately, the base layer 820 may not be formed.

Figure 7C:
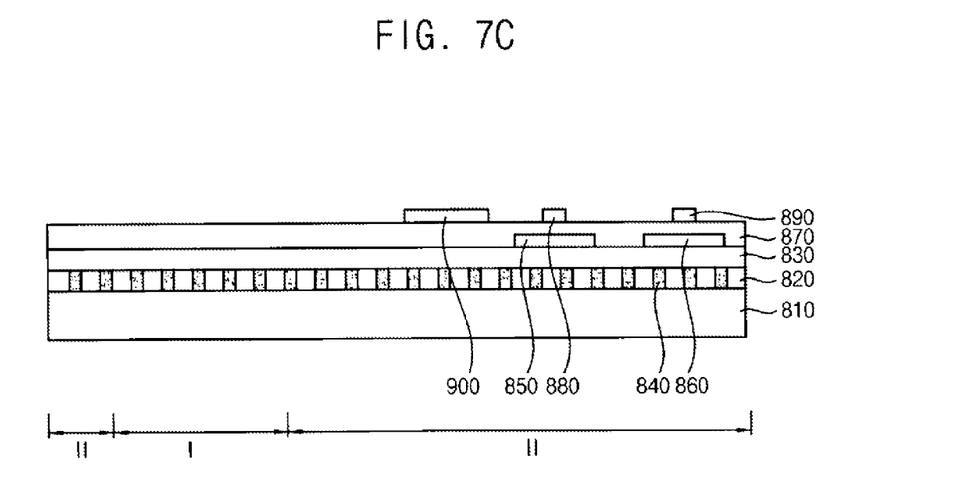

Referring to FIG. 7C, a buffer layer 830 may be formed on the base layer 820, and may extend from the pixel region I to the peripheral region II. The buffer layer 830 may be formed using silicon nitride, silicon oxide, etc. For example, the substrate 810 may be formed using a flexible transparent resin, and the buffer layer 830 may be formed using silicon nitride, silicon oxide, etc. When the buffer layer 830 is formed using the silicon oxide, a light generated from a light emitting layer may travel through the buffer layer 830.

First and second active patterns 850 and 860 may be formed spacing apart from each other by a predetermined distance in the peripheral region II on the buffer layer 830. In example embodiments, each of first and second active patterns 850 and 860 may be simultaneously formed using an oxide semiconductor, an inorganic semiconductor, e.g., amorphous silicon, polysilicon, etc., an organic semiconductor, etc.

A gate insulating layer 870 may be formed on the buffer layer 830. The gate insulating layer 870 may cover the first and second active patterns 850 and 860, and may extend into the pixel region I. For example, the gate insulating layer 870 may be formed using a silicon compound, a metal oxide, etc. In example embodiments, when the gate insulating layer 870 and the buffer layer 830 are formed using the same materials, the gate insulating layer 870 and the buffer layer 830 may have the same refractive index in the pixel region I. Thus, light transmittivity may be increased in the pixel region I.

A first gate electrode 880 may be formed on the gate insulating layer 870 under which the first active pattern 850 is located. A second gate electrode 890 may be formed on the gate insulating layer 870 under which the second active pattern 860 is located. A first capacitor electrode 900 may be formed on the gate insulating layer 870. The first capacitor electrode 900 may be formed spacing apart from the first gate electrode 880 by predetermined distances. In example embodiments, the first gate electrode 880, the second gate electrode 890, and the first capacitor electrode 900 may be simultaneously formed using metal, alloy, metal nitride, conductive metal oxide, a transparent conductive material, etc.

Figure 7D:
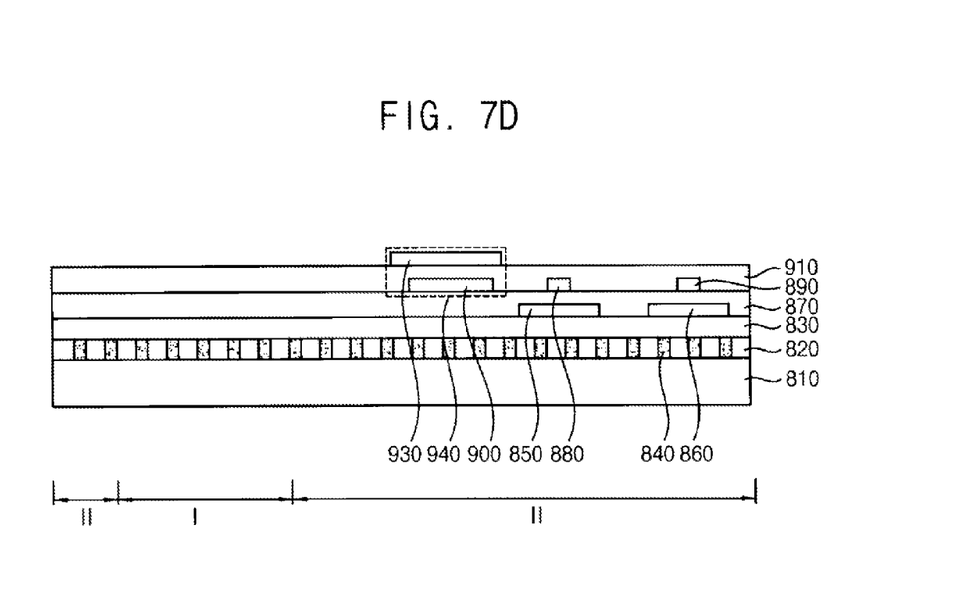

Referring to FIG. 7D, a first insulating layer 910 may be formed on the gate insulating layer 870. The first insulating layer 910 may cover the first capacitor electrode 900, the first gate electrode 880, and the second gate electrode 890, and may extend into the pixel region I. For example, the first insulating layer 910 may be formed using a silicon compound, a metal oxide, etc. In example embodiments, when the first insulating layer 910, the gate insulating layer 870 and the buffer layer 830 are formed using the same materials, the first insulating layer 910, the gate insulating layer 870 and the buffer layer 830 may have the same refractive index in the pixel region I. Thus, light transmittivity may be increased in the pixel region I.

As a second capacitor electrode 930 may be formed on the first insulating layer 910 under which the first capacitor electrode 900 is located, a storage capacitor 940 including the first capacitor electrode 900 and the second capacitor electrode 930 may be formed. In example embodiments, the second capacitor electrode 930 may be formed using a material substantially the same as that of the first gate electrode 880, the second gate electrode 890, and the first capacitor electrode 900.

Figure 7E:
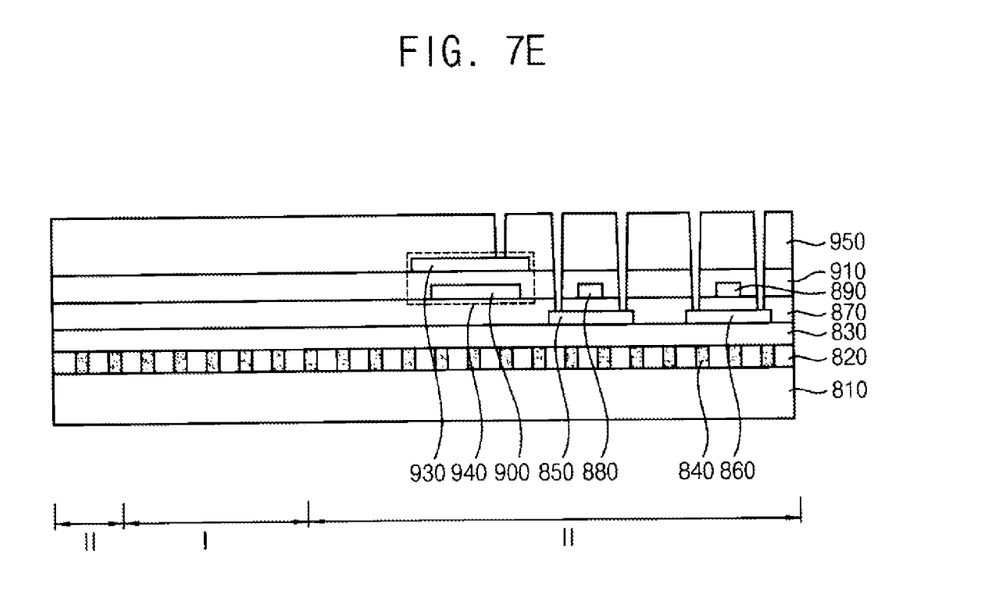

Referring to FIG. 7E, a planarization layer 950 may be formed on the first insulating layer 910. The planarization layer 950 may be formed using a silicon compound, a metal oxide, etc. The planarization layer 950 may cover the second capacitor electrode 930, and may extend into the pixel region I. Then, first through fifth contact holes may be formed in the peripheral region II of the planarization layer 950. The first contact hole may extend to and expose a first portion of the second capacitor electrode 930. The second and third contact holes may extend to and expose second and third portions of the first active pattern 850, respectively. The fourth and fifth contact holes may extend to and expose fourth and fifth portions of the second active pattern 860, respectively. In example embodiments, when the planarization layer 950, the first insulating layer 910, the gate insulating layer 870 and the buffer layer 830 are formed using the same materials, the planarization layer 950, the first insulating layer 910, the gate insulating layer 870 and the buffer layer 830 may have the same refractive index in the pixel region I. Thus, light transmittivity may be increased in the pixel region I.

Figure 7F:
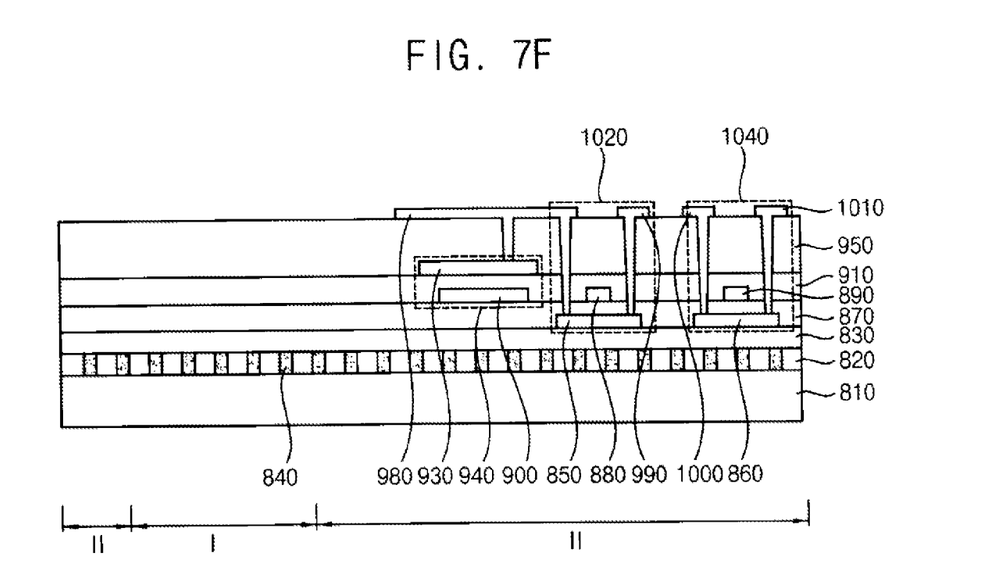

Referring to FIG. 7F, a power supply electrode 980, a first source electrode of a driving transistor 1020, a first drain electrode 990 of the driving transistor 1020, a second source electrode 1000 of a switching transistor 1040, a second drain electrode 1010 of the switching transistor 1040 may be formed in the peripheral region II on the planarization layer 950. For example, in a forming process of the power supply electrode 980, the power supply electrode 980 fills the first contact hole, and may extend into the first contact hole. The power supply electrode 980 which extends into the first contact hole may contact the first portion of the second capacitor electrode 930. At the same time, the power supply electrode 980 fills the second contact hole, and may extend into the second contact hole. The power supply electrode 980 which extends into the second contact hole may contact the second portion of the first active pattern 850. Here, the first source electrode of the driving transistor 1020 may be formed. In similar, in a forming process of the first drain electrode 990, the first drain electrode 990 fills the third contact hole, and may extend into the third contact hole. The first drain electrode 990 which extends into the third contact hole may contact the third portion of the first active pattern 850. Thus, the driving transistor 1020 including the first source electrode, the first drain electrode 990, the first gate electrode 880, and the first active pattern 850 may be composed.

In a forming process of the second source electrode 1000, the second source electrode 1000 fills the fourth contact hole, and may extend into the fourth contact hole. The second source electrode 1000 which extends into the fourth contact hole may contact the fourth portion of the second active pattern 860. In a forming process of the second drain electrode 1010, the second drain electrode 1010 fills the fifth contact hole, and may extend into the fifth contact hole. The second drain electrode 1010 which extends into the fifth contact hole may contact the fifth portion of the second active pattern 860. Thus, the switching transistor 1040 including the second source electrode 1000, the second drain electrode 1010, the second gate electrode 890, and the second active pattern 860 may be composed. In example embodiments, each of the power supply electrode 980, the first source electrode of the driving transistor 1020, the first drain electrode 990 of the driving transistor 1020, the second source electrode 1000 of the switching transistor 1040, and the second drain electrode 1010 of the switching transistor 1040 may be simultaneously formed using metal, alloy, metal nitride, conductive metal oxide, a transparent conductive material, etc.

Figure 7G:
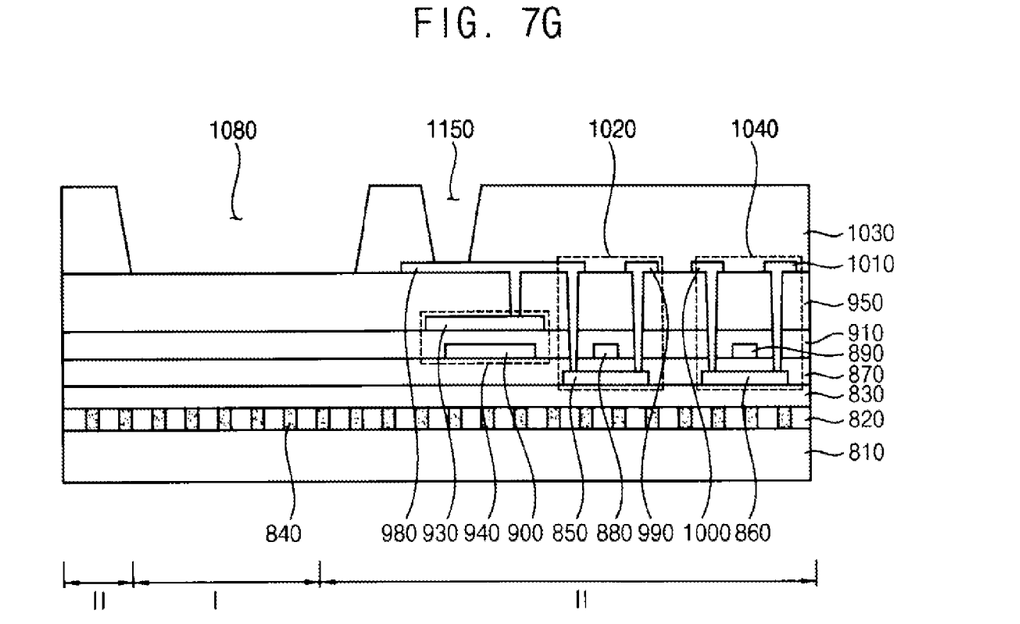

Referring to FIG. 7G, a second insulating layer 1030 may cover the power supply electrode 980, the first source electrode, the first drain electrode 990, the second source electrode 1000, and the second drain electrode 1010. After the second insulating layer 1030 is entirely formed, a first opening 1080 and a second opening 1150 may be formed in the second insulating layer 1030. The first opening 1080 of the second insulating layer 1030 may be formed in the pixel region I, and the second opening 1150 of the second insulating layer 1030 may be formed in the peripheral region II. The second insulating layer 1030 may be formed using an inorganic material or an organic material.

Figure 7H:
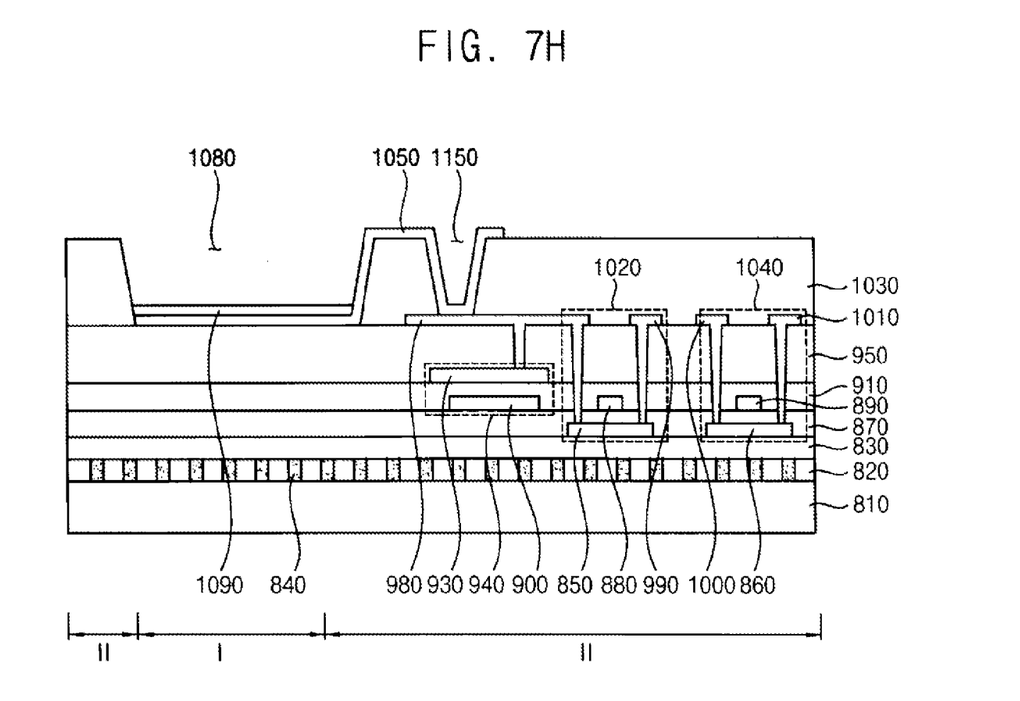

Referring to FIG. 7H, a portion of a first electrode 1050 may be formed on the planarization layer 950 via the first opening 1080 of the second insulating layer 1030. The first electrode 1050 formed in the first opening 1080 may extend into the peripheral region II, and may contact a portion of the power supply electrode 980 via the second opening 1150. The first electrode 1050 may be formed using metal, alloy, metal nitride, conductive metal oxide, a transparent conductive material, etc.

Referring to FIG. 7I, a light emitting layer 1090 may be formed on the first electrode 1050. The light emitting layer 1090 may be formed using light emitting materials capable of generating different colors of light, e.g., a red color of light, a blue color of light, and a green color of light. Selectively, the light emitting layer 1090 may generally generate a white color of light by stacking a plurality of light emitting materials capable of generating different colors of light such as a red color of light, a green color of light, a blue color of light, etc.

A pixel defining layer 1070 may be formed on a portion of the light emitting layer 1090, a portion of the first electrode 1050, and a portion of the second insulating layer 1030. The pixel defining layer 1070 may electrically insulate the first electrode 1050 and a second electrode 1110. The pixel defining layer 1070 may be formed using organic materials or inorganic materials. Alternately, the pixel defining layer 1070 may be formed using a material substantially the same as that of the second insulating layer 1030.

The second electrode 1110 may be formed on the pixel defining layer 1070 and the light emitting layer 1090. For example, the second electrode 1110 may be formed as a substantially uniform thickness along a profile of the pixel defining layer 1070 and the light emitting layer 1090. That is, the second electrode 1110 may be entirely formed in the pixel region I and the peripheral region II. In example embodiments, the second electrode 1110 may be formed using a metal, an alloy, metal nitride, conductive metal oxide, a transparent conductive material, etc.

An encapsulation substrate 1130 may be formed on the second electrode 1110. For example, the encapsulation substrate 1130 may be formed along a profile of the second electrode 1110. The encapsulation substrate 1130 may be formed using a transparent material or flexible plastic. In example embodiments, the encapsulation substrate 1130 may include a stacked structure where at least one organic layer and at least one inorganic layer are alternately stacked.

The example embodiments may be applied to various display devices including a mirror OLED device. For example, the example embodiments may be employed in an office-mirror device, a toilet-mirror device, a public area-mirror device and vehicle-mirror device, a ship-display device, an aircraft-display device, portable communication devices, display devices for display or for information transfer, a medical-display device, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An organic light emitting display device comprising:
   a substrate;
   a light emitting structure on the substrate;
   an encapsulation substrate on the light emitting structure, the encapsulation substrate having a stacked structure where at least one organic layer and at least one inorganic layer are alternately stacked, the organic layer being disposed on the inorganic layer; and
   a reflective metal layer interposed between the organic layer and the inorganic layer, the reflective metal layer including a plurality of nanowires and a plurality of openings that is defined by the nanowires, wherein the nanowires of the reflective metal layer include a plurality of first nanowires extending along a first direction and a plurality of second nanowires extending along a second direction that is perpendicular to the first direction, wherein the first nanowires and the second nanowires are crossed with each other at the same level on the substrate, the first nanowires and the second nanowires each contacting both the organic layer and the inorganic layer, and wherein an entire upper surface of the first and second nanowires is in directly contact with an entire lower surface of the organic layer, and an entire lower surface of the first and second nanowires is in directly contact with an entire upper surface of the inorganic layer.

2. The organic light emitting display device of claim 1, wherein a lower surface of the reflective metal layer is in directly contact with the inorganic layer, and an upper surface of the reflective metal layer is in directly contact with the organic layer.

3. The organic light emitting display device of claim 1, wherein the first nanowires have a first thickness and a first width,
wherein the first nanowires are spaced apart from each other by a first distance.

4. The organic light emitting display device of claim 3, wherein the second nanowires have a second thickness and a second width, and
wherein the second nanowires are spaced apart from each other by a second distance.

5. The organic light emitting display device of claim 4, wherein a reflective index and a transmittivity of the organic light emitting display device are controlled according to the first and second thicknesses, the first and second widths, and the first and second distances.

6. The organic light emitting display device of claim 5, wherein a size of each of the openings is controlled according to the first and second distances.

7. The organic light emitting display device of claim 1, wherein the reflective metal layer has a mesh structure.

8. The organic light emitting display device of claim 1, wherein each of the openings of the reflective metal layer has a planar shape of a rectangular opening or a square opening.

9. The organic light emitting display device of claim 2, wherein the upper surface is configured to reflect an incident light passing through the encapsulation substrate.

10. The organic light emitting display device of claim 1, wherein the substrate includes flexible transparent materials.

11. The organic light emitting display device of claim 1, wherein the light emitting structure includes:
a first electrode disposed on the substrate;
a light emitting layer disposed on the first electrode; and
a second electrode disposed on the light emitting layer,
wherein the inorganic layer is disposed on the second electrode.

12. The organic light emitting display device of claim 11, wherein a light configured to be generated from the light emitting layer travels via the openings of the reflective metal layer.

13. The organic light emitting display device of claim 1, wherein the organic layer includes at least one selected from photoresist, polyimide-based resin, acrylic-based resin, polyamide-based resin, siloxane-based resin, olefin-based resin, acrylate monomer, phenylacetylene, diamine, dianhydride, silane, parylene, PE, PP, PET, epoxy resin, fluoro resin, polysiloxane.

14. The organic light emitting display device of claim 1, wherein the inorganic layer includes at least one selected from silicon oxide, silicon nitride, silicon oxynitride, silicon oxycarbide, silicon carbonitride, aluminium oxide, aluminium nitride, titanium oxide, zinc oxide.

15. The organic light emitting display device of claim 1, wherein the reflective metal layer includes materials having a high reflective index such as gold, silver, aluminum, platinum, nickel, titanium.

* * * * *